US009977487B2

(12) United States Patent
Choi et al.

(10) Patent No.: US 9,977,487 B2
(45) Date of Patent: *May 22, 2018

(54) DYNAMIC NON-VOLATILE MEMORY OPERATION SCHEDULING FOR CONTROLLING POWER CONSUMPTION OF SOLID-STATE DRIVES

(71) Applicant: Samsung Electronics Co., Ltd., Suwon-si, Gyeonggi-do (KR)

(72) Inventors: Stephen Choi, Redwood City, CA (US); Byoung Young Ahn, San Jose, CA (US); Yang Seok Ki, Palo Alto, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/615,910

(22) Filed: Jun. 7, 2017

(65) Prior Publication Data

US 2017/0269669 A1 Sep. 21, 2017

Related U.S. Application Data

(63) Continuation-in-part of application No. 14/967,220, filed on Dec. 11, 2015, now Pat. No. 9,711,232.

(Continued)

(51) Int. Cl.
*G11C 16/30* (2006.01)
*G06F 1/32* (2006.01)
(Continued)

(52) U.S. Cl.
CPC .............. *G06F 1/329* (2013.01); *G06F 1/206* (2013.01); *G06F 1/3275* (2013.01); *G06F 3/0688* (2013.01); *G06F 9/546* (2013.01)

(58) Field of Classification Search
CPC ........................................................ G11C 5/14
(Continued)

(56) References Cited

U.S. PATENT DOCUMENTS 8,473,669 B2   6/2013   Sinclair
8,555,095 B2   10/2013  Byom et al.
(Continued)

OTHER PUBLICATIONS

Mu-Hsi Kuo et al., "A Disk State-Aware Task Scheduler with Energy Efficient Prefetching and Caching," 2013 IEEE Third International Conference on Cloud and Green Computing, Feb. 2013, pp. 42-47, IEEE Computer Society.

(Continued)

*Primary Examiner* — Min Huang
(74) *Attorney, Agent, or Firm* — Innovation Counsel LLP

(57) ABSTRACT

A memory device and a method for rescheduling memory operations is disclosed. The method includes receiving memory operations for memory arrays of a memory device; storing the memory operations in queues associated with the memory array; estimating power consumption for each of the memory operations queued in the queues based on a power model; determining that a memory operation causes an estimated power consumption of the memory device to be exceeded over an allowable power budget within a first time window; determining a candidate memory operation in the queues that is scheduled to operate in a second time window after the first time window, wherein the candidate memory operation has less power consumption than the memory operation according to the power model; and dynamically reordering the memory operations in the queues and generating rescheduled memory operations by reordering the memory operation out of the first time window and reordering the candidate memory operation into the first time window.

22 Claims, 9 Drawing Sheets

Related U.S. Application Data

(60) Provisional application No. 62/222,087, filed on Sep. 22, 2015.

(51) Int. Cl.
*G06F 9/54* (2006.01)
*G06F 3/06* (2006.01)
*G06F 1/20* (2006.01)

(58) Field of Classification Search
USPC .................................................. 711/E12.001
See application file for complete search history.

(56) References Cited

U.S. PATENT DOCUMENTS

| | | | |
|---|---|---|---|
| 8,738,866 B2 | 5/2014 | Sonoda et al. | |
| 8,756,369 B2 | 6/2014 | McKean et al. | |
| 8,873,284 B2 | 10/2014 | Sinclair et al. | |
| 9,711,232 B2* | 7/2017 | Choi | G11C 16/30 |
| 2005/0259496 A1* | 11/2005 | Hsu | G06F 1/206 |
| | | | 365/226 |
| 2009/0006739 A1* | 1/2009 | Lubbers | G06F 3/0613 |
| | | | 711/114 |
| 2012/0002472 A1* | 1/2012 | Futatsuyama | G11C 11/10 |
| | | | 365/185.09 |
| 2012/0246435 A1* | 9/2012 | Meir | G06F 13/00 |
| | | | 711/169 |
| 2012/0303171 A1* | 11/2012 | Barrett | H04W 52/0264 |
| | | | 700/295 |
| 2012/0331207 A1* | 12/2012 | Lassa | G06F 1/206 |
| | | | 711/103 |
| 2014/0185376 A1 | 7/2014 | Sinclair et al. | |
| 2014/0223077 A1 | 8/2014 | Suzumura | |
| 2015/0089164 A1* | 3/2015 | Ware | G11C 5/02 |
| | | | 711/149 |

OTHER PUBLICATIONS

Inseok Stephen Choi et al., "Solid State Memory System With Power Management Mechanism and Method of Operation Thereof," U.S. Patent and Trademark Office, priority date: Sep. 16, 2015, U.S. Appl. No. 14/976,309, filed Dec. 21, 2015, 28 pages.

Inseok Stephen Choi et al., "System and Method for Controlling Power Consumption," U.S. Patent and Trademark Office, priority date: Sep. 14, 2015, U.S. Appl. No. 14/967,266, filed Dec. 11, 2015, 39 pages.

* cited by examiner

DYNAMIC NON-VOLATILE MEMORY OPERATION SCHEDULING FOR CONTROLLING POWER CONSUMPTION OF SOLID-STATE DRIVES

CROSS-REFERENCE TO RELATED APPLICATION(S)

This application is a continuation-in-part application claiming the benefit of and priority to U.S. patent application Ser. No. 14/967,220 filed Dec. 11, 2015, which claims the benefit of and priority to U.S. Provisional Patent Application Ser. No. 62/222,087 filed Sep. 22, 2015, the disclosures of which are incorporated herein by reference in their entirety.

TECHNICAL FIELD

The present disclosure relates generally to memory systems for computers and, more particularly, to a system and method for dynamically scheduling memory operations to control power consumption of a solid-state drive (SSD).

BACKGROUND

Flash memory is widely used in consumer electronics products for its non-volatility, reliability, low power consumption, and shock resistance. NOR and NAND flash memories have emerged as the dominant varieties of flash memory. Because of its small cell size and a low cost-per-bit, NAND flash memory is suitable for a high-density data storage medium for consumer devices such as digital cameras and solid-state drives (SSDs). NOR flash has typically been used for code storage and direct execution in portable electronics devices, such as cellular phones and personal digital assistants (PDAs). Moreover, SSDs' superior performance, energy efficiency, and energy proportionality over hard disk drives (HDDs) have catalyzed broad and fast adoption not only in consumer products, but also in data-center and enterprise products.

In NAND flash memory, a programming (or write) operation has a longer latency compared to a read operation. In addition, old data should be erased prior to programming new data to a NAND cell. An erase operation cannot be selectively performed at a cell level, resulting in even a longer latency than the programming latency. Multi-level cell (MLC) NAND flash memory stores multiple states per NAND cell and multiplies the data storage capacity. For example, three-level cell (TLC) NAND flash memory has a density of 3 bits per cell. However, MLC flash memory further decreases the operation speed due to its complex read/programming/erase operations.

The power consumption of electric devices has become a critical metric along with traditional performance metrics for both data center and consumer electronics products. For mobile devices, the battery life is limited, therefore power usage of the components needs to be carefully monitored and controlled to extend the battery life. In data centers, the raw electrical and cooling cost can be of a significant portion of the total operational cost, so the power consumption of the servers can no longer be a lower priority consideration. In addition, modern data center servers have begun to adopt high performance SSDs such as non-volatile memory express (NVMe) devices. A typical NVMe device includes a high-performance central processing unit (CPU) and large dynamic random-access memories (DRAMs). Such high-performance NVMe device can easily consume 25 W, which is a significant amount of power consumption in a data center configuration.

With the requirement of good energy proportionality, that is, proportionally low power consumption is expected for low utilization of a given device, the power consumption of a device can be dynamically changed according to its utilization and/or user settings. The same principal is directly applicable to devices in the consumer market. Mobile devices, such as smartphones, tablet PCs, and laptop computers, have begun to adopt high performance SSDs, such as Peripheral Component Interconnect Express (PCIe)-based SSDs. Power consumption of a SSD is controlled to be minimal, for example, when a laptop computer is unplugged from a power outlet.

Due to its small cell size, high density, low power and high endurance, modern SSDs commonly utilize NAND flash memory as storage media. NAND flash has asymmetric latency and power consumption characteristics. To hide high latency in programming and erasing due to the asymmetric characteristics of NAND flash memory, multiple NAND operations, also referred to as parallelism, may be executed simultaneously. Examples of the parallelism includes multi-plane, data interleave, and multi-channel operations. Due to the parallelism, modern SSDs including NAND flash memory naturally introduce an operation scheduling problem. In addition, existing memory systems require an application programming interface (API) to control dynamic average power consumption. Examples of such API include running average power limit by INTEL, dynamic voltage frequency scaling (DVFS), and power states.

SUMMARY

According to one embodiment, a method includes: receiving a plurality of memory operations for one or more memory arrays of a memory device via a memory channel; storing the plurality of memory operations in one or more queues associated with the memory arrays; estimating power consumption for each of the plurality of memory operations queued in the one or more queues based on a power model; determining that at least one memory operation causes an estimated power consumption of the memory device to be exceeded over an allowable power budget within a first time window; determining one or more candidate memory operations in the one or more queues that are scheduled to operate in a second time window after the first time window, wherein the one or more candidate memory operations have less power consumption than the at least one memory operation according to the power model; dynamically reordering the plurality of memory operations in the one or more queues and generating rescheduled memory operations by reordering the at least one memory operation out of the first time window and reordering the one or more candidate memory operations into the first time window; and fetching the rescheduled memory operations to the one or more memory arrays.

According to another embodiment, a method includes: receiving a plurality of memory operations for one or more memory arrays of a memory device via a memory channel; storing the plurality of memory operations in one or more queues associated with the memory arrays; grouping the plurality of memory operations in a plurality of groups of memory operations; estimating power consumption for each of the plurality of groups of memory operations; determining that a first group of memory operations causes an estimated power consumption of the memory device to be exceeded over an allowable power budget within a first time window; determining a second group of memory operations that are scheduled to operate in a subsequent time window after the first time window, wherein the second group of memory operations have less power consumption than the first group of memory operations; and dynamically reordering the groups of memory operations in one or more queues and generating rescheduled memory operations by reordering the first group of memory operation out of the first time window and reordering the second group of memory operations into the first time window.

According to yet another embodiment, a memory device includes: one or more memory arrays; a memory channel configured to receive a plurality of memory operations for the one or more memory arrays from a host computer; one or more queues configured to store the memory operations; and a scheduler configured to: store the plurality of memory operations in one or more queues associated with the one or more memory arrays; estimate power consumption for each of the plurality of memory operations queued in the one or more queues based on a power model; determine that at least one memory operation causes an estimated power consumption of the memory device to be exceeded over an allowable power budget within a first time window; determine one or more candidate memory operations in the one or more queues that are scheduled to operate in a second time window after the first time window, wherein the one or more candidate memory operations have less power consumption than the at least one memory operation according to the power model; dynamically reorder the plurality of memory operations in the one or more queues and generating rescheduled memory operations by reordering the at least one memory operation out of the first time window and reordering the one or more candidate memory operations into the first time window; and fetch the rescheduled memory operations to the one or more memory arrays.

According to yet another embodiment, a memory device includes: one or more memory arrays; a memory channel configured to receive a plurality of memory operations for the one or more memory arrays from a host computer; one or more queues configured to store the memory operations; and a scheduler configured to: store the plurality of memory operations in one or more queues associated with the one or more memory arrays; group the plurality of memory operations in a plurality of groups of memory operations; estimate power consumption for each of the plurality of groups of memory operations; determine that a first group of memory operations causes an estimated power consumption of the memory device to be exceeded over an allowable power budget within a first time window; determine a second group of memory operations that are scheduled to operate in a subsequent time window after the first time window, wherein the second group of memory operations have less power consumption than the first group of memory operations; and dynamically reorder the groups of memory operations in the one or more queues and generating rescheduled memory operations by reordering the first group of memory operation out of the first time window and reordering the second group of memory operations into the first time window.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

Figure 1:
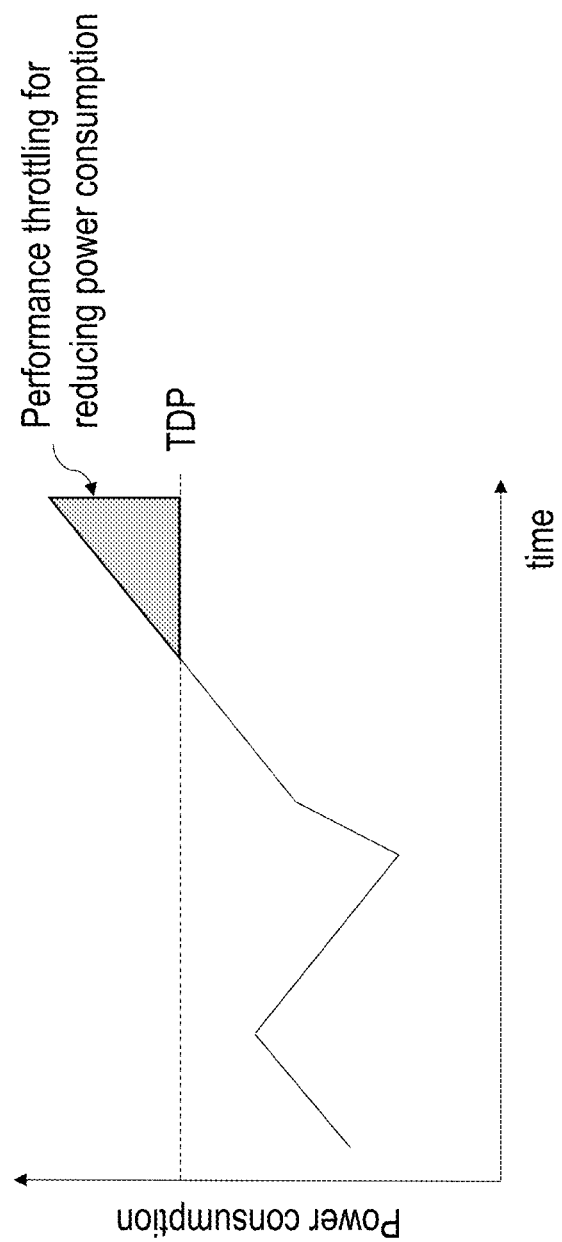
FIG. 1 shows an example graph for performance throttling to protect an SSD.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide dynamic memory operation scheduling for non-volatile memory. The dynamic memory operation scheduling provides a fine temporal granularity in controlling power consumption of a solid-state drive including non-volatile memory such as NAND flash memory. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

Modern SSDs are commonly equipped with a performance throttling feature. The performance throttling feature lowers the performance of an SSD to reduce its power consumption. FIG. 1 shows an example graph for performance throttling to protect an SSD. The performance throttling feature can primarily protect circuits and components of the SSD from exceeding a power threshold over allowed power consumption, herein referred to as thermal design power (TDP). By forcefully reducing the power consumption or even turning off the power, the performance throttling feature can prevent the circuits and components of the SSD from thermal or electric damages when the SSD runs too hot or allows too much current. However, such a conventional performance throttling feature merely responds to a temperature reading from a thermostat or a power meter (e.g., voltage/current meter) of the system, thus it may not be adequate to dynamically control power consumption of the SSD.

Figure 2:
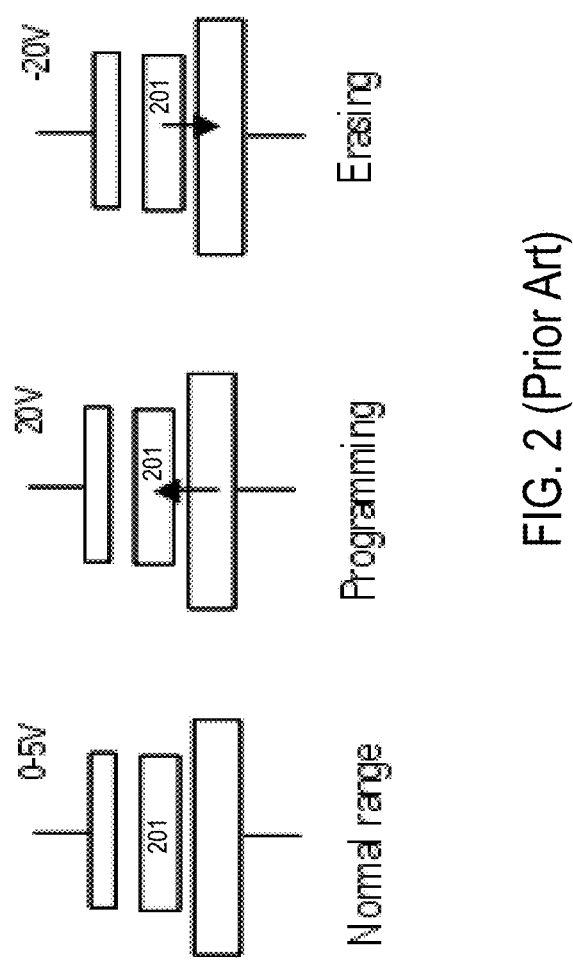
FIG. 2 illustrates Fowler-Nordheim tunneling effect of a NAND flash memory.

FIG. 2 illustrates the Fowler-Nordheim tunneling effect of a NAND flash memory. NAND flash memory has asymmetric latency and power consumption characteristics. For example, a read (or sensing) operation requires a nominal voltage for operation (e.g., 5V), however a programming operation or an erasure operation requires a higher voltage (e.g., 20V for programming and −20V for erasing) than the nominal voltage. In addition, unlike a reading operation that senses a charge of a given NAND cell, programming and erasing operations require an injection or a removal of charge to/from a floating gate 201. Fowler-Nordheim (FN) tunneling takes longer, and as a result, programming and erasure operations are slower than a reading operation by orders of magnitude.

Figure 3:
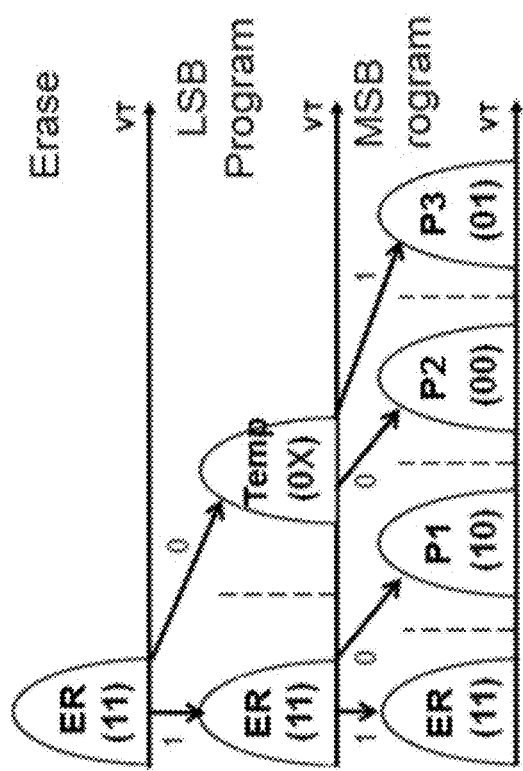
FIG. 3 illustrates an example process for NAND programming for a multi-level cell (MLC) NAND flash memory.

FIG. 3 illustrates an example process for NAND programming for a multi-level cell (MLC) NAND flash memory. Unlike a single-level cell (SLC), the MLC NAND flash memory stores multiple states per a NAND cell. Due to a higher data storage density per memory cell, the MLC NAND flash memory provides larger logical capacity in a given SSD. However, the MLC NAND flash memory introduces a complex read/program/erase mechanism. As shown in FIG. 3, an MLC programming involves two phases, least significant bit (LSB) and most significant bit (MSB) programming.

The MLC programming commonly utilizes an incremental step pulse programming (ISPP) for a fine control in threshold voltages. The ISPP injects charges incrementally to a cell with a predetermined step size. However, MLC NAND flash memory introduces another asymmetric characteristic. The MSB programming takes much longer than the LSB programming due to the multiple threshold levels. For example, the MLC programming has three threshold levels whereas the SLC flash memory has only one threshold level. In addition, the MLC programming requires a requisite finer control to set the threshold voltages properly. In many NAND chips, the MSB programming is ten times slower than the LSB programming. For this reason, the MSB programming is referred to as "slow page programming," and the LSB programming is referred to as "fast page programming." Those words are interchangeably used.

Figure 4:
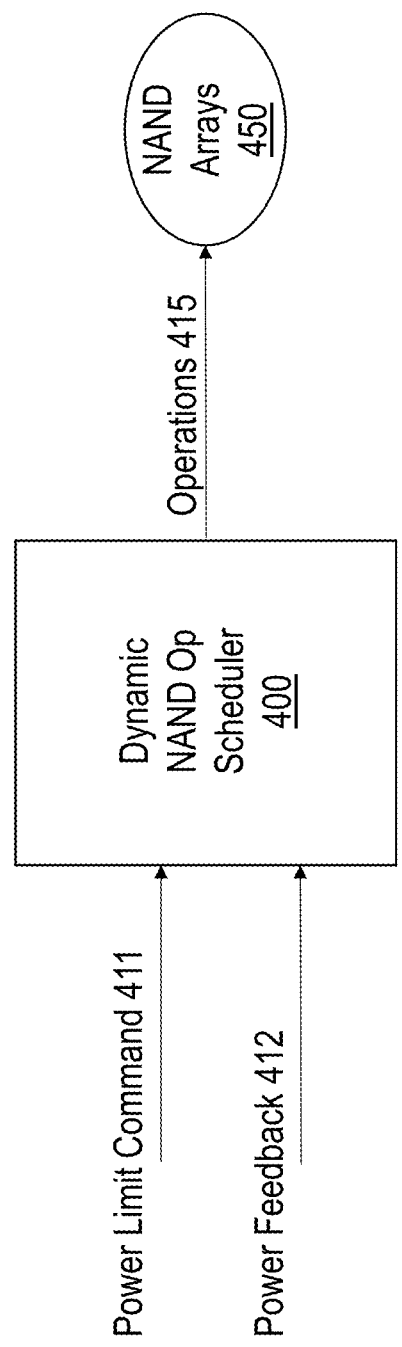
FIG. 4 is a block diagram of an example dynamic memory operation scheduler, according to one embodiment.

According to one embodiment, the present disclosure provides a dynamic memory operation scheduler for a solid-state drive. The scheduler is capable of dynamically controlling the power consumption of the SSD. FIG. 4 is a high-level block diagram of an example dynamic memory operation scheduler, according to one embodiment. According to one embodiment, the scheduler 400 is implemented in a hardware logic device as firmware.

The dynamic memory operation scheduler 400 can receive a power limit command 411 and power consumption feedback 412 from a host computer, a user, and/or a memory controller. For example, the power limit command can be generated by a user, an operating system, or datacenter/server-management software. In another example, the power limit command can be generated by a power-measurement circuit on the SSD or a host computer, or any other part of the system depending on the system configuration. The power limit command 411 may include an allowed power budget for a given time window. Using the power limit command 411 and the power consumption feedback 412, the scheduler 400 can schedule and control fetching NAND operations 415 over NAND arrays 450 of an SSD. According to one embodiment, the scheduler 400 can control fetching NAND operations according to a scheduling policy. The scheduling policy is programmable and configurable by the user from the host computer. The scheduler 400 can assign different priorities over queued NAND operations according to the scheduling policy and maintains power consumption of the NAND arrays 450 under an assigned budget specified by the user.

Modern SSDs utilize parallelism at a NAND array level to hide the latency. To achieve the parallelism, the memory controller of an SSD simultaneously fetches multiple memory operations to the NAND arrays. Such simultaneous operations may utilize multiple memory channels, interleaving, and multiple planes. Some parallelism is based on NAND array organization, but other parallelisms may rely on NAND chip construction, such as through multiple planes. Traditionally, the parallelism is mainly used to boost SSD performance without considering the associated increased power consumption, except only for the performance throttling in terms of the TDP. The TDP is mainly intended for device protection from a thermal or electrical event. Until the total power consumption exceeds the TDP, the SSD fetches as many operations as possible to achieve the maximum performance.

Figure 5:
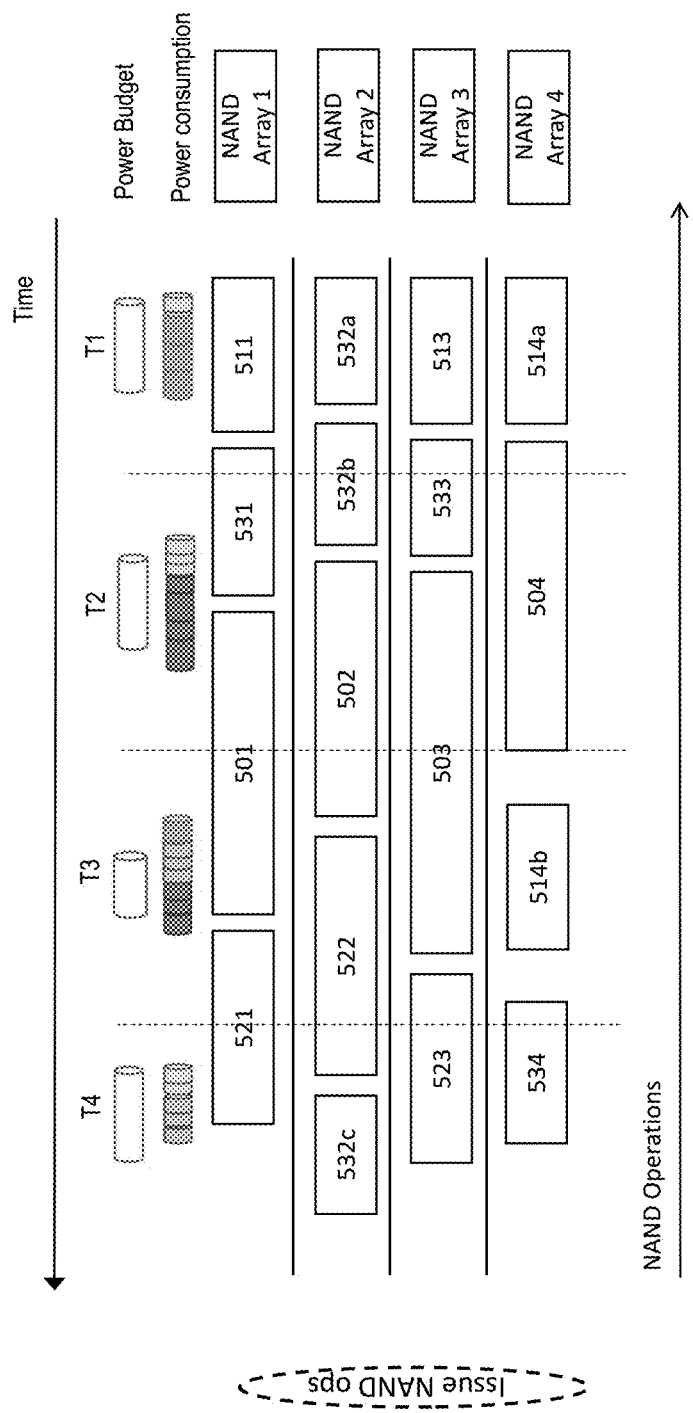
FIG. 5 shows conventional NAND operation scheduling scheme without a power constraint.

FIG. 5 shows a conventional NAND operation scheduling scheme without a power constraint. In one embodiment, the power constraint is divided into a series of time windows. The time windows denoted as T1, T2, T3, and T4 represent time periods for assigning a power budget and controlling power consumption. The length of the time windows may vary depending on the memory system, the application, and/or the desired granularity of the power consumption control. In the present example, the time windows are uniform, but it is understood that the time windows may be adjusted dynamically depending on various factors such as the user setting, the application, time of a day, and the number of NAND arrays that are simultaneously accessed. For example, during peak hours, the memory system may monitor and control power consumption with a finer granularity under an allowed power budget to achieve more efficient power consumption.

A host memory controller (not shown) of a memory system typically issues NAND operations to an SSD to achieve the maximum parallelism and performance. A memory controller of the SSD (e.g., slave memory controller) can receive the NAND operations from the host memory controller via allocated memory channels and stores the NAND operations in queues (e.g., internal buffers of the SSD) assigned for each of the NAND arrays. The memory controller of the SSD can fetch the NAND operations to the corresponding NAND arrays in the order the NAND operations are stored in the queues.

Heavy utilization of the parallelism may result in a non-trivial power consumption variation over time. Therefore, the total power consumption by the NAND arrays may be mainly determined by the currently active NAND operations over the NAND arrays, and the combination of the NAND operations. It is noted that different types of NAND operations can consume a different degree of power as shown in FIG. 2.

The power consumption in each time window can vary depending on the type and order of NAND operations received from the memory controller. For example, NAND array 1 receives slow page programming operations 511, a read operation 531, an erase operation 501, and a fast page programming operation 521. NAND array 2 simultaneously receives read operations 532a and 532b, an erase operation 502, a fast page programming operation 522, and another read operation 532c. NAND array 3 simultaneously receives a slow page programming operation 513, a read operation 533, an erase operation 503, and a fast page programming operation 523. NAND array 4 simultaneously receives a slow page programming operation 514a, an erase operation 504, and a second slow page programming operation 514b, and a read operation 534.

During a given time window, the type and number of NAND operations performed in the respective NAND arrays of the SSD can vary, therefore the power consumption in each time window can vary accordingly. Erase operations (e.g., 501, 502, 503, and 504) take longer and consume more power than programming and read operations. The programming operations can include slow and fast page programming operations. Slow page programming operations (e.g., 511, 513, 514a, and 514b) consume more power than fast page programming operations (e.g., 521, 522, and 523). Read operations (e.g., 531, 532a, 532b, 532c, 533, and 534) take the least time and consume the least power compared to the erase and programming operations. Although the present example shows only four types of NAND operations (i.e., read, slow page programming, fast page programming, and erase), the NAND operations are not limited thereto. Instead, other NAND operations that are received from the host memory controller or NAND activities that may be internally generated by the memory controller of the SSD may be added to the queues and performed by the designated NAND arrays without deviating from the scope of the present disclosure. For example, the SSD internal operations may include garbage collection, wear leveling, and erase block preparation activities. The scheduler 400 can perform those SSD internal operations when a high power budget is available or when the memory system is under a low workload condition.

The power consumption for each time window can be calculated by a physical reading of power consumption of the SSD, for example, using a thermostat or a power meter. In another example, the power consumption can be calculated based on a mathematical model using the number and type of NAND operations pending in the queues for each given time window. A data center where the SSD is located may be temperature controlled, therefore the ambient temperature may be known. In this case, the calculation of the power consumption can be performed using a simpler model without taking into account other environmental factors. In one embodiment, the power consumption model can refer to the physical reading of power consumption to better predict the trend of power consumption in the forthcoming time windows.

Further, the overall power consumption in a given time window, combining the power consumption of all NAND arrays in the SSD, can be divided and grouped together based on the NAND operation types. The estimated power consumption can be obtained by the expected power consumption of the NAND operation types in a given time window. In the present example, the time window T2 includes erase operations 501, 502, 503, and 504 to the NAND arrays 1-4, respectively. Since time window T2 includes more erase operations than other time windows, the power consumption in time window T2 is expected to be higher than the power consumption in time windows T1, T3, and T4. Without a power constraint, when power consumption exceeds an allowed TDP in a given time window, the NAND operations in the queues may be suspended until the power consumption is reduced below the TDP. When the TDP is reached, the memory controller of the SSD may determine whether to completely suspend all the pending queues or partially suspend the operations based on a priority. For example, when the power consumption in T2 exceeded the TDP, the NAND operations for NAND arrays 3 and 4 may be suspended and only NAND arrays 1 and 2 may continue to operate.

Figure 6:
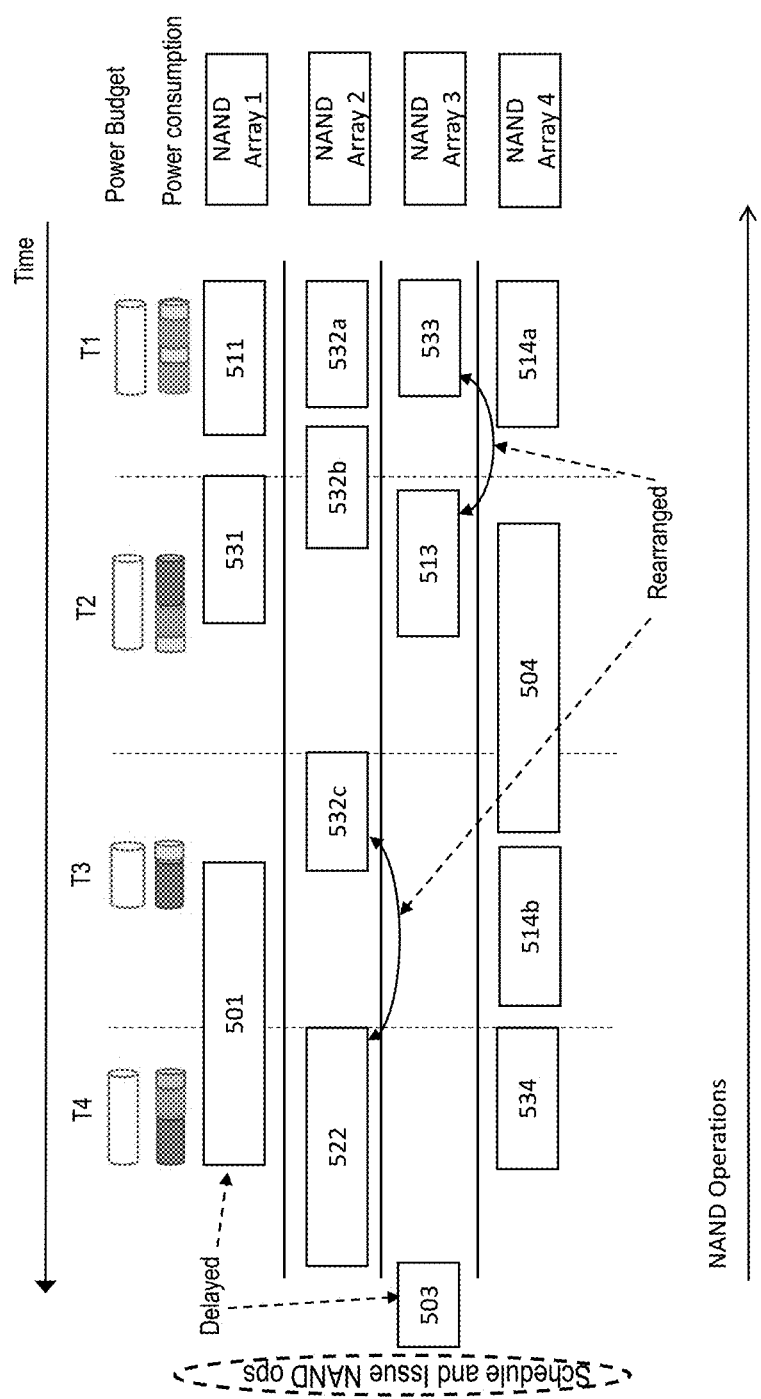
FIG. 6 shows an example dynamic memory operation scheduling scheme with power constraints, according to one embodiment.

FIG. 6 shows an example dynamic memory operation scheduling scheme, according to one embodiment. The present dynamic memory operation scheduler 400 shown in FIG. 4 can perform dynamic memory operations including operation scheduling, delayed operation issuance, and memory operation rearrangement. Within an allowed power budget for a given time window, the scheduler 400 may delay some NAND operations. For NAND operations that need not be in a temporal order, the scheduler 400 may rearrange the operation order to meet the allowed power budget for a given time window.

According to one embodiment, the present dynamic memory operation scheduler 400 can control a number of active NAND operations to meet a predetermined power constraint. To achieve this, the scheduler 400 can delay or rearrange further NAND operations in the queues not to exceed the power budget for a given time window.

Once the power budget is already consumed for a given time window, the scheduler 400 can pause further operation fetching to the NAND arrays to prevent excessive power consumption. Referring to the comparative example of FIG. 5, the expected power consumption for time windows T1, T2, and T3 are higher than the corresponding power budget. For time window T4, the power consumption is lower than the allowed power budget. The power budgets for each time window are different, and can be dynamically assigned by a user or operating conditions of the SSD.

In particular, a power budget for time window T1 is lower than the actual (or estimated) power consumption of time window T1. Therefore, the power budget for time window T1 is exhausted. In this case, the scheduler 400 can delay the pending NAND operations 531 for NAND array 1 and 504 for NAND array 4 and fetch the pending operations in the next available time window, in this case time window T2. It is noted that the read operation 532b of NAND array 2 can be unaffected due to its higher priority than the priorities of the delayed NAND operations 531 and 504. Further, the power budget in time window T3 is dynamically reduced to complete the long erase operation initiated in the time window T2. To meet the reduced power budget in T3, the scheduler 400 can further delay the erase operations 501 and 503 for NAND arrays 1 and 3, respectively. The scheduler 400 can dynamically determine a duration of the delay based on the allowed power budget in the current and next time windows. The scheduler 400 can reschedule the NAND operations independently of the granularity of the time windows. For example, the start time of a delayed operation may not necessarily align with a start of the next available time window. For example, the erase operation 501 that was originally scheduled to be performed in T2 (see FIG. 5) may start in the middle of time window T3.

The delay of a NAND operation is, in a sense, similar to the suspension of NAND operations when a TDP is reached. However, the delayed NAND operations by the scheduler 400, according to the present disclosure, can be deterministic and dynamically controlled by monitoring the power consumption and rescheduling NAND operations in the queues with delays and rearrangement based on the power budget and the priorities of pending NAND operations.

In time window T3, only a small amount of power budget is available due to the long erase operation initiated at the time window T2. For this reason, the scheduler 400 can prohibit programming operations for the NAND array 2 from being fetched in time window T3. Instead, the scheduler 400 can rearrange the NAND operations by re-ordering them in the queue for the NAND array 2. For example, the read operation 532c is executed prior to the fast page programming operation 522. Similarly, the slow page programming 513 is executed after the read operation 533 for NAND array 3. The delay and rearrangement of NAND operations by the scheduler 400 not only meet the power consumption constraints, but also increase performance of the SSD because the power budget for a given time window is efficiently filled with NAND operations available in the queues. Some of the NAND operations may not be rearrangeable. For example, a read and a programming operation to the same memory address cannot be rearranged because the requested read data may be changed after the programming operation. When rearranging the NAND operations in a queue, the scheduler 400 can determine whether the NAND operations can be rearranged or need to be delayed. Delay of NAND operations does not typically cause a conflict that may arise for rearrangement.

According to one embodiment, the scheduler 400 can meet the power budget by finding and fetching applicable NAND operations for each of the time windows T1, T2, T3, and T4. The power budget requirement may be dynamically assigned by a user from a host computer (e.g., a system administrator of a data center). For a given power budget, the scheduler 400 can rearrange and delays the NAND operations in the queues based on a scheduling policy. In one embodiment, the scheduling policy can be affected by a window size of pending NAND operations in the queues. For example, the depth of the queue is 10, the search of a candidate NAND operation for delay or rearrangement may be limited to the window size of five operations. If the candidate NAND operation within the window size cannot meet the power budget of a given time window, the next pending NAND operation may be delayed instead of searching beyond the window size. It is understood that various scheduling policies may be applied without deviating from the scope of the present disclosure. In addition to the user-defined power budget, the scheduling policy may dynamically change depending on other operational and environmental factors such as the ambient temperature in a data center, time of a day, and a predicted use of the SSD and types of NAND operations.

Figure 7:
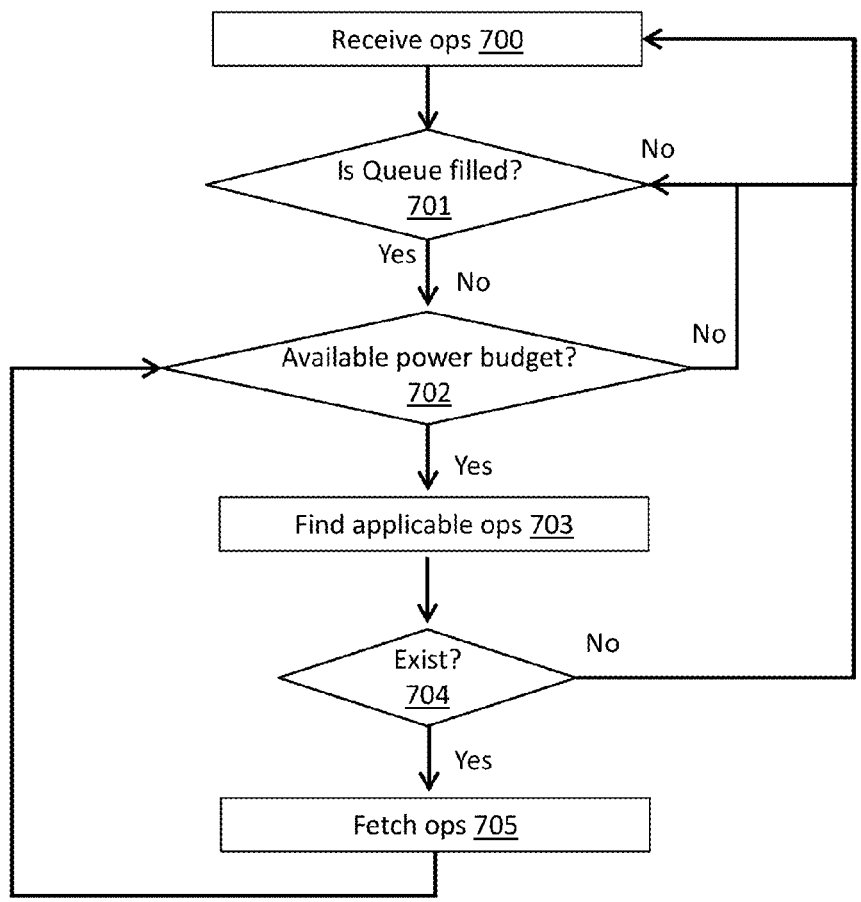
FIG. 7 shows an example flowchart of the present dynamic memory operation scheduler, according to one embodiment.

FIG. 7 shows an example flowchart of the present dynamic memory operation scheduler, according to one embodiment. The scheduler 400 can receive NAND operations from a host memory controller and store the received NAND operations in queues (step 700). The scheduler can continue to receive NAND operations until the queues are filled (step 701). The scheduler 400 can check if there is an available power budget, and if so determine whether the power budget is being met at the current and forthcoming time windows (step 702). If there is no available power budget, in other words, when there is no power constraint for the current and forthcoming time windows, the scheduler 400 can continue to receive NAND operations and performs the NAND operations in the order they are stored in the queues.

If there is an available power budget for the current and forthcoming time windows, the scheduler 400 can apply an operation scheduling policy to find applicable NAND operations in the queues (step 703). The scheduler 400 can determine whether an applicable NAND operation exists (step 704). The applicable NAND operations may be found in the same queues to meet the power budget. In one embodiment, the applicable NAND operations that are identified by the scheduler 400 can be fetched ahead of the next pending NAND operation in the queue (step 705).

For example, referring to FIG. 6, the read operation 532c is placed ahead of the fast page programming operation 522 for NAND array 2. Similarly, the slow page programming 513 is placed after the read operation 533 for NAND array 3. When no applicable NAND operations are found in the same queue, the next NAND operation in the queue may be delayed. In addition, the scheduler 400 can delay the erase operations 501 and 503 for NAND arrays 1 and 3. The rearrangement and delay of the NAND operations in the queues may occur in the same queue as shown in FIG. 6. However, it is understood that pending NAND operations in one queue may be fetched in another queue if necessary.

Each scheduling policy may be related to each operation's power consumption profile and quality of service (QoS), or other requirement specified by the host computer or a user. For example, if there is no further metadata for operations, the scheduler 400 follows a First-In-First-Out (FIFO) policy while applying rescheduling if there is a power budget. A window size to find applicable operations can be either statically configured or dynamically configured by a user command. The scheduler 400 can set the window size based on the user command received from the host computer or the user. While finding candidate operations for fetching, shortest job first (SJF) can be similarly applied by changing it to find the minimum power consumption operation first (MOF) to maximize a throughput and performance with a given power budget for a certain time window.

According to one embodiment, the present scheduler for dynamic operation scheduling can be easily extended to support QoS. Once each operation comes with a deadline as metadata, the scheduler can apply earliest deadline first (EDF) with power constraint feasibility to meet the QoS requirement.

Figure 8:
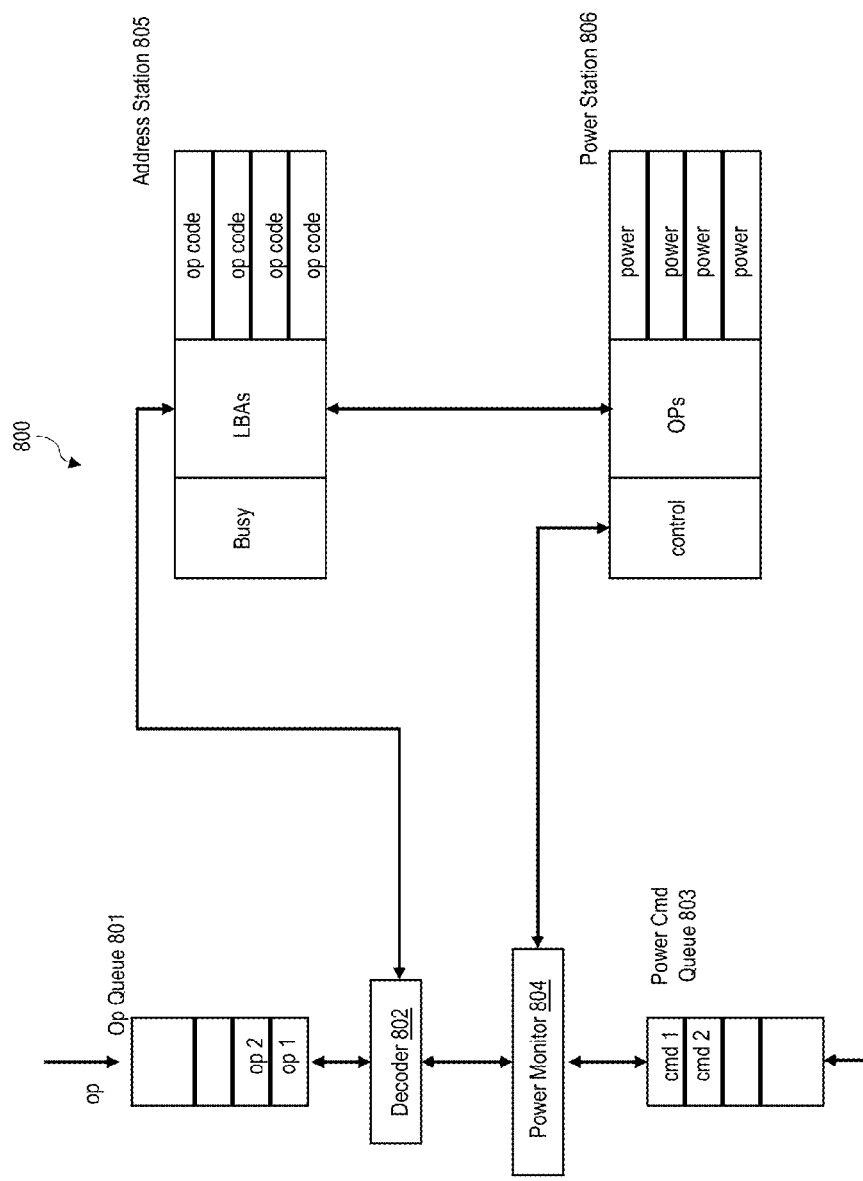
FIG. 8 shows an operational schematic diagram of an example dynamic NAND operation scheduler, according to one embodiment.

FIG. 8 shows an operational schematic diagram of an example dynamic NAND operation scheduler, according to one embodiment. The scheduler 800 includes an operational queue 801, a decoder 802, power command queue 803, a power monitor 804, an address station 805, and a power station 806. The NAND operations received from a host memory controller are stored in the operational queue 801. The power commands (e.g., the power limit command 411 and the power consumption feedback 412 of FIG. 4) received from a host computer, a user, and/or the host memory controller are separately stored in the power command queue 803. The decoder 802 decodes the NAND operations and stores in the address station 805 op codes and the associated logical block addresses (LBAs) for each of the decoded NAND operations. The address station also has a register that represents the status of the address NAND flash memory. The power monitor 804 interprets the received power commands and generates power control commands in the power station 806. The power station 806 can also have a status flag that represents the status of the NAND flash memory (e.g., busy, ready, error).

According to one embodiment, the address station 803 can control advanced scheduling features such as operation merges. For example, if there are two writes on the same LBA, the first write operation can be discarded and only the second write operation is executed.

According to one embodiment, the power monitor 804 and the power station 806 can monitor per channel and per die power consumption rather than the whole power consumption of an attached device. In this case, power execution control and NAND operation scheduling can be performed based on the knowledge of power consumption per channel and per die.

The following pseudo code explains the operations of the example dynamic NAND operation scheduler 800. The issue function issues a NAND operation to the address station 805, and the exec function controls execution in the power station 806. Both the issue and exec functions receive an NAND operation and the associated logical address of a NAND flash.

Figure 9:
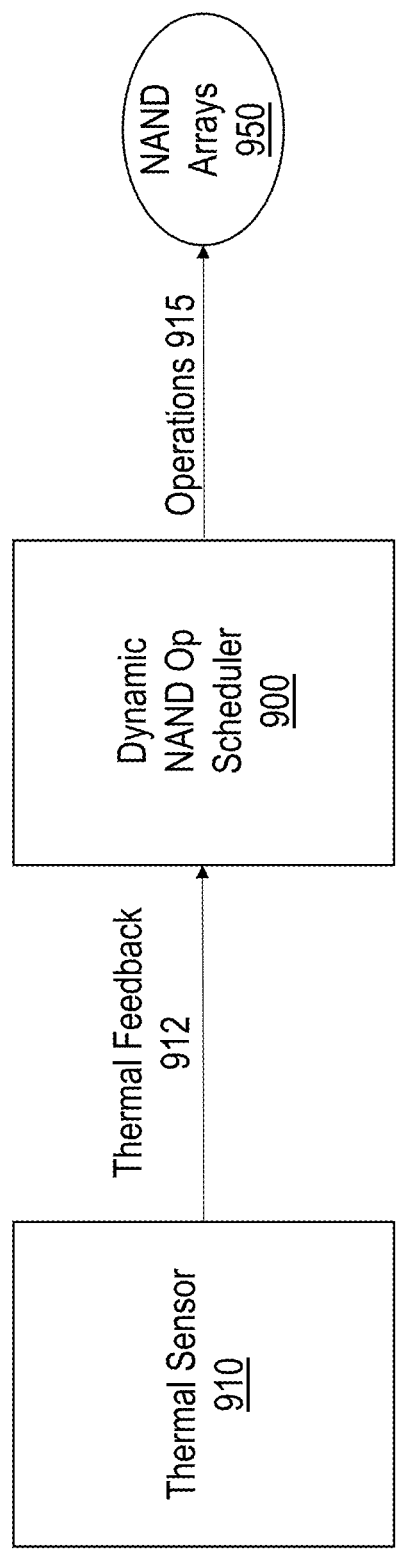
FIG. 9 is a block diagram of an example dynamic memory operation scheduler, according to another embodiment.

The issue function first checks Read After Write (RAW) or Write After Write (WAW).

function issue (op, LBA)//issue op to address station wait until (! Busy[ALL] AND !(write & LBA));//check RAW or WAW
    Busy[s]←Yes;
    OpCode[s]←op;
    LBA[s]←LBA;

The exec function waits until the power is below budget, and finds the next NAND operation based on a scheduling policy.

function exec (op, LBA)//control execution in power station wait until (power is below budget);//power monitor logic find next op ( );//based on different policy, e.g. greedy, etc.
    Control[s]←Exec;
    Op[s]←op;
    Power[s]←power;

FIG. 9 is a block diagram of an example dynamic memory operation scheduler, according to another embodiment. The scheduler 900 can dynamically rearrange memory operations to protect circuits and components of the NAND array 950 of a memory device in an event of a thermal issue, for example, a temperature reading exceeding a threshold temperature. A thermal sensor 910 generates a thermal feedback 912 and sends the thermal feedback 912 to the scheduler 900. The thermal sensor 910 may be a thermostat or a power meter (e.g., voltage/current meter) that may be coupled to one or more of the NAND arrays 950. The scheduler 900 can actively control the dynamic rearrangement of memory operations based on the thermal feedback 912.

In some embodiments, the scheduler 900 can schedule and control fetching memory operations over NAND arrays to keep the temperature of the memory device under a threshold temperature. The dynamic rearrangement of the memory operations by the scheduler 900 may include a pause of memory operations for a predetermined time period or a time delay until the temperature reading drops below the threshold temperature. The scheduler 900 can assign different priorities over the queued memory operations and maintain the power consumption of the NAND arrays 950 while keeping the temperature below the threshold temperature.

According to one embodiment, the present dynamic memory operation scheduler can estimate the power consumption of memory operations by measuring weights corresponding to one or more parameters of the memory device. Examples of such parameters that are factored in when calculating the estimated power consumption can include, but are not limited to, a channel identity, a die identity, a plane identity, a block size, a page size, and a NAND type (e.g., SLC, MLC, TLC) of the memory device. That is, the device can track the physical power requirements of operations not just for the device as a whole, but also as they vary across distinct sub-components of the device. Thus, the present dynamic memory operation scheduler can rearrange the memory operations based on the weighted estimation of the power consumption for the queued memory operations as they relate to specific physical components on which the memory operations take place.

According to one embodiment, the present dynamic memory operation scheduler can record power consumption of processed memory operations and keep track of the consumed power in a table. Additionally, or alternatively, the power consumption can be estimated based on a power model. According to one embodiment, the actual consumed power consumption may be measured using a micro power meter integrated in the memory device. The estimated power consumption based on the power model may be compared against the actual power consumption measured by the micro power meter. Depending on the comparison result, the power model may be updated and fine-tuned to reflect the actual power consumption when the memory operations are processed by the dynamic rearrangement. Such operations may be tracked according to the physical location and attributes of the physical process of the operation, as described above (e.g., tracking power use by operation cross referenced with a physical die, a channel, and/or a memory type)

According to one embodiment, the host computer can identify memory operations that can be prioritized (or de-prioritized) over other memory operations. According to one embodiment, the host computer can set the priority of memory operations. Based on the priority setting by the host computer, the present dynamic memory operation scheduler can dynamically rearrange the memory operations. The memory device may not guarantee a specific ordering of memory operations based on their priority. In this case, the host computer can enforce a specific ordering of memory operations based on the priority, and the present dynamic memory operation scheduler can reorder the specific ordering of memory operations within the constraints of the order enforced by the host computer based on the power consumption.

According to one embodiment, either the host computer or the present dynamic memory operation scheduler can group memory operations in groups based on a priority. When the groups of memory operations are reordered, the present dynamic memory operations scheduler can insert a flush operation between the reordered groups of memory operations.

An application running on the host computer generally has more information about the nature or importance of memory operations. In this case, the application can designate a group of memory operations that can be reordered. For example, an application may have a pre-fetch functionality that moves data it suspects that it might need from storage into memory for future (potential) use. Because this is a speculative transaction, and is not guaranteed to be needed. These transactions can be designated by the application as subject to re-ordering.

A non-volatile dual in-line memory module (NVDIMM) refers to a memory module that can contain various media types or a mix of media types including non-volatile memories (e.g., NAND flash memory) and traditional dynamic random-access memories (DRAMs). The NVDIMM can plug into a DIMM socket and appear to be a standard DDR synchronous DRAM (SDRAM) memory module to a host memory controller. The NVDIMM interface is a DDR-extended memory interface that allows the host computer and the memory module to communicate asynchronously over a DDR memory channel. An NVDIMM may share the DDR memory channel with another standard DDR DIMM.

According to one embodiment, the present SSD is NVDIMM compatible and includes a DRAM and one or more NAND arrays. Some of the memory operations can be assigned to the DRAM while other memory operations are assigned to NAND arrays. The memory controller of the NVDIMM has more information about the NAND arrays of the NVDIMM and has more DRAM storage than a conventional SSD. The NVDIMM can run a dynamic memory operation scheduler that can reorder the queued memory operations more aggressively and efficiently using a wider window of memory I/O scheduling than a conventional SSD.

The NVDIMM can have more than one chip corresponding to one or more NAND arrays. The power model can be run per each chip, or there can be one power meter or a temperature sensor corresponding to each chip. The present dynamic memory operation scheduler can reorder memory operations based on the multiple power models or multiple power readings or temperature readings corresponding to each chip of the NVDIMM, similar to the disclosure above According to one embodiment, the present dynamic memory operation scheduler can perform some memory operations using a cache or a buffer instead of the SSD. Depending on a power consumption, the present memory controller can change a cache policy. For example, a cache can be write-through or write-back. If a group of memory operations includes intensive updates and needs to activate more channels and chips to execute, the present memory controller can switch a cache policy from write-through to write-back to reduce the memory I/O traffics to the SSD.

According to one embodiment, a method includes: receiving a plurality of memory operations for one or more memory arrays of a memory device via a memory channel; storing the plurality of memory operations in one or more queues associated with the memory arrays; estimating power consumption for each of the plurality of memory operations queued in the one or more queues based on a power model; determining that at least one memory operation causes an estimated power consumption of the memory device to be exceeded over an allowable power budget within a first time window; determining one or more candidate memory operations in the one or more queues that are scheduled to operate in a second time window after the first time window, wherein the one or more candidate memory operations have less power consumption than the at least one memory operation according to the power model; dynamically reordering the plurality of memory operations in the one or more queues and generating rescheduled memory operations by reordering the at least one memory operation out of the first time window and reordering the one or more candidate memory operations into the first time window; and fetching the rescheduled memory operations to the one or more memory arrays.

The method may further include: receiving a temperature reading from a thermal sensor associated with the one or more memory arrays; and determining that at least one memory operation causes a temperature of the memory device to be exceeded over an allowable temperature within the first time window based on the estimated power consumption of the at least one memory operation.

The method may further include: calculating the estimated power consumption for each of the plurality of memory operations based on at least one parameter associated with a physical attribute of the one or more memory arrays.

Each of the at least one parameter may be given a weight to estimate the power consumption.

The at least one parameter may include one or more of a set comprising: a channel identity, a die identity, a plane identity, a block size, a page size, and a NAND type of the memory device.

The method may further include: recording an actual power consumption; comparing the actual power consumption with the estimated power consumption; and updating the power model based on a comparison result of the actual power consumption against the estimated power consumption.

The memory device may be a non-volatile dual in-line memory module (NVDIMM) including a DRAM and one or more NAND arrays.

The NVDIMM may have one or more chips corresponding one or more NAND arrays, and a power model corresponding to each of one or more chips is used for estimating the power consumption.

The memory device may include a cache, and the plurality of memory operations may correspond to memory operations affecting the cache.

A cache policy may be switched depending on the power consumption.

According to another embodiment, a method includes: receiving a plurality of memory operations for one or more memory arrays of a memory device via a memory channel; storing the plurality of memory operations in one or more queues associated with the memory arrays; grouping the plurality of memory operations in a plurality of groups of memory operations; estimating power consumption for each of the plurality of groups of memory operations; determining that a first group of memory operations causes an estimated power consumption of the memory device to be exceeded over an allowable power budget within a first time window; determining a second group of memory operations that are scheduled to operate in a subsequent time window after the first time window, wherein the second group of memory operations have less power consumption than the first group of memory operations; and dynamically reordering the groups of memory operations in one or more queues and generating rescheduled memory operations by reordering the first group of memory operation out of the first time window and reordering the second group of memory operations into the first time window.

According to yet another embodiment, a memory device includes: one or more memory arrays; a memory channel configured to receive a plurality of memory operations for the one or more memory arrays from a host computer; one or more queues configured to store the memory operations; and a scheduler configured to: store the plurality of memory operations in one or more queues associated with the one or more memory arrays; estimate power consumption for each of the plurality of memory operations queued in the one or more queues based on a power model; determine that at least one memory operation causes an estimated power consumption of the memory device to be exceeded over an allowable power budget within a first time window; determine one or more candidate memory operations in the one or more queues that are scheduled to operate in a second time window after the first time window, wherein the one or more candidate memory operations have less power consumption than the at least one memory operation according to the power model; dynamically reorder the plurality of memory operations in the one or more queues and generating rescheduled memory operations by reordering the at least one memory operation out of the first time window and reordering the one or more candidate memory operations into the first time window; and fetch the rescheduled memory operations to the one or more memory arrays.

The scheduler may be further configured to: receive a temperature reading from a thermal sensor associated with the one or more memory arrays; and determine that at least one memory operation causes a temperature of the memory device to be exceeded over an allowable temperature within the first time window based on the estimated power consumption of the at least one memory operation.

The scheduler may be further configured to: calculate the estimated power consumption for each of the plurality of memory operations based on at least one parameter associated with a physical attribute of the one or more memory arrays.

Each of the at least one parameter may be given a weight to estimate the power consumption.

The at least one parameter may include one or more of a set comprising: a channel identity, a die identity, a plane identity, a block size, a page size, and a NAND type of the memory device.

The scheduler may be further configured to: record an actual power consumption; compare the actual power consumption with the estimated power consumption; and update the power model based on a comparison result of the actual power consumption against the estimated power consumption.

The memory device may be a non-volatile dual in-line memory module (NVDIMM) including a DRAM and one or more NAND arrays.

The NVDIMM may have one or more chips corresponding one or more NAND arrays, and a power model corresponding to each of the one or more chips is used for estimating the power consumption.

The memory device may include a cache, and the plurality of memory operations may correspond to memory operations affecting the cache.

A cache policy may be switched depending on the power consumption.

According to yet another embodiment, a memory device includes: one or more memory arrays; a memory channel configured to receive a plurality of memory operations for the one or more memory arrays from a host computer; one or more queues configured to store the memory operations; and a scheduler configured to: store the plurality of memory operations in one or more queues associated with the one or more memory arrays; group the plurality of memory operations in a plurality of groups of memory operations; estimate power consumption for each of the plurality of groups of memory operations; determine that a first group of memory operations causes an estimated power consumption of the memory device to be exceeded over an allowable power budget within a first time window; determine a second group of memory operations that are scheduled to operate in a subsequent time window after the first time window, wherein the second group of memory operations have less power consumption than the first group of memory operations; and dynamically reorder the groups of memory operations in the one or more queues and generating rescheduled memory operations by reordering the first group of memory operation out of the first time window and reordering the second group of memory operations into the first time window.

The above example embodiments have been described hereinabove to illustrate various embodiments of implementing a system and method for dynamically scheduling memory operations for non-volatile memory. Various modifications and departures from the disclosed example embodiments will occur to those having ordinary skill in the art. The subject matter that is intended to be within the scope of the present disclosure is set forth in the following claims.

What is claimed is:

1. A method comprising:
receiving a plurality of memory operations for one or more memory arrays of a memory device via a memory channel;
storing the plurality of memory operations in one or more queues associated with the memory arrays;
estimating power consumption for each of the plurality of memory operations queued in the one or more queues based on a power model;
determining that at least one memory operation causes an estimated power consumption of the memory device to be exceeded over an allowable power budget within a first time window;
determining one or more candidate memory operations in the one or more queues that are scheduled to operate in a second time window after the first time window, wherein the one or more candidate memory operations have less power consumption than the at least one memory operation according to the power model;
dynamically reordering the plurality of memory operations in the one or more queues and generating rescheduled memory operations by reordering the at least one memory operation out of the first time window and reordering the one or more candidate memory operations into the first time window; and
fetching the rescheduled memory operations to the one or more memory arrays.

2. The method of claim 1 further comprising:
receiving a temperature reading from a thermal sensor associated with the one or more memory arrays; and
determining that at least one memory operation causes a temperature of the memory device to be exceeded over an allowable temperature within the first time window based on the estimated power consumption of the at least one memory operation.

3. The method of claim 1, further comprising: calculating the estimated power consumption for each of the plurality of memory operations based on at least one parameter associated with a physical attribute of the one or more memory arrays.

4. The method of claim 3, wherein each of the at least one parameter is given a weight to estimate the power consumption.

5. The method of claim 4, wherein the at least one parameter includes one or more of a set comprising: a channel identity, a die identity, a plane identity, a block size, a page size, and a NAND type of the memory device.

6. The method of claim 1, further comprising:
recording an actual power consumption;
comparing the actual power consumption with the estimated power consumption; and
updating the power model based on a comparison result of the actual power consumption against the estimated power consumption.

7. A method comprising:
receiving a plurality of memory operations for one or more memory arrays of a memory device via a memory channel;
storing the plurality of memory operations in one or more queues associated with the memory arrays;
grouping the plurality of memory operations in a plurality of groups of memory operations;
estimating power consumption for each of the plurality of groups of memory operations;
determining that a first group of memory operations causes an estimated power consumption of the memory device to be exceeded over an allowable power budget within a first time window;
determining a second group of memory operations that are scheduled to operate in a subsequent time window after the first time window, wherein the second group of memory operations have less power consumption than the first group of memory operations; and
dynamically reordering the groups of memory operations in one or more queues and generating rescheduled memory operations by reordering the first group of memory operation out of the first time window and reordering the second group of memory operations into the first time window.

8. The method of claim 1, wherein the memory device is a non-volatile dual in-line memory module (NVDIMM) including a DRAM and one or more NAND arrays.

9. The method of claim 8, wherein the NVDIMM has one or more chips corresponding one or more NAND arrays, and a power model corresponding to each of one or more chips is used for estimating the power consumption.

10. The method of claim 1, wherein the memory device includes a cache, and the plurality of memory operations corresponds to memory operations affecting the cache.

11. The method of claim 10, wherein a cache policy is switched depending on the power consumption.

12. A memory device comprising:
one or more memory arrays;
a memory channel configured to receive a plurality of memory operations for the one or more memory arrays from a host computer;
one or more queues configured to store the memory operations; and
a scheduler configured to:
store the plurality of memory operations in one or more queues associated with the one or more memory arrays;
estimate power consumption for each of the plurality of memory operations queued in the one or more queues based on a power model;
determine that at least one memory operation causes an estimated power consumption of the memory device to be exceeded over an allowable power budget within a first time window;
determine one or more candidate memory operations in the one or more queues that are scheduled to operate in a second time window after the first time window, wherein the one or more candidate memory operations have less power consumption than the at least one memory operation according to the power model;
dynamically reorder the plurality of memory operations in the one or more queues and generating rescheduled memory operations by reordering the at least one memory operation out of the first time window and reordering the one or more candidate memory operations into the first time window; and
fetch the rescheduled memory operations to the one or more memory arrays.

13. The memory device of claim 11, wherein the scheduler is further configured to:
receive a temperature reading from a thermal sensor associated with the one or more memory arrays; and
determine that at least one memory operation causes a temperature of the memory device to be exceeded over an allowable temperature within the first time window based on the estimated power consumption of the at least one memory operation.

14. The memory device of claim 12, wherein the scheduler is further configured to:
calculate the estimated power consumption for each of the plurality of memory operations based on at least one parameter associated with a physical attribute of the one or more memory arrays.

15. The memory device of claim 14, wherein each of the at least one parameter is given a weight to estimate the power consumption.

16. The memory device of claim 15, wherein the at least one parameter includes one or more of a set comprising: a channel identity, a die identity, a plane identity, a block size, a page size, and a NAND type of the memory device.

17. The memory device of claim 12, wherein the scheduler is further configured to:
record an actual power consumption;
compare the actual power consumption with the estimated power consumption; and
update the power model based on a comparison result of the actual power consumption against the estimated power consumption.

18. A memory device comprising:
one or more memory arrays;
a memory channel configured to receive a plurality of memory operations for the one or more memory arrays from a host computer;
one or more queues configured to store the memory operations; and
a scheduler configured to:
store the plurality of memory operations in one or more queues associated with the one or more memory arrays;
group the plurality of memory operations in a plurality of groups of memory operations;
estimate power consumption for each of the plurality of groups of memory operations;
determine that a first group of memory operations causes an estimated power consumption of the memory device to be exceeded over an allowable power budget within a first time window;
determine a second group of memory operations that are scheduled to operate in a subsequent time window after the first time window, wherein the second group of memory operations have less power consumption than the first group of memory operations; and
dynamically reorder the groups of memory operations in the one or more queues and generating rescheduled memory operations by reordering the first group of memory operation out of the first time window and reordering the second group of memory operations into the first time window.

19. The memory device of claim 12, wherein the memory device is a non-volatile dual in-line memory module (NVDIMM) including a DRAM and one or more NAND arrays.

20. The memory device of claim 19, wherein the NVDIMM has one or more chips corresponding one or more NAND arrays, and a power model corresponding to each of the one or more chips is used for estimating the power consumption.

21. The memory device of claim 12, wherein the memory device includes a cache, and the plurality of memory operations corresponds to memory operations affecting the cache.

22. The memory device of claim 21, wherein a cache policy is switched depending on the power consumption.

* * * * *